(12) United States Patent
Yeh

(10) Patent No.: US 10,832,932 B2
(45) Date of Patent: Nov. 10, 2020

(54) SEMICONDUCTOR PRODUCT TESTING DEVICE USING AN ELECTRIC STATIC CARRIER

(71) Applicant: Hsiu Hui Yeh, Taipei (TW)

(72) Inventor: Hsiu Hui Yeh, Taipei (TW)

( * ) Notice: Subject to any disclaimer, the term of this patent is extended or adjusted under 35 U.S.C. 154(b) by 0 days.

(21) Appl. No.: 16/086,612

(22) PCT Filed: Feb. 8, 2018

(86) PCT No.: PCT/CN2018/075792
§ 371 (c)(1),
(2) Date: Sep. 20, 2018

(87) PCT Pub. No.: WO2018/157718
PCT Pub. Date: Sep. 7, 2018

(65) Prior Publication Data
US 2019/0378743 A1    Dec. 12, 2019

(30) Foreign Application Priority Data

Mar. 2, 2017  (CN) .......................... 2017 1 0120079

(51) Int. Cl.
*H01L 21/683* (2006.01)
*G01R 31/26* (2020.01)
*H01L 21/67* (2006.01)
*H01L 21/687* (2006.01)

(52) U.S. Cl.
CPC ...... *H01L 21/6833* (2013.01); *G01R 31/2601* (2013.01); *H01L 21/67288* (2013.01); *H01L 21/68707* (2013.01); *H01L 21/68764* (2013.01)

(58) Field of Classification Search
CPC .......... H01L 21/6833; H01L 21/67288; H01L 21/68707; H01L 21/68764; H01L 21/6831; G01R 31/2601; G01R 31/00; G01R 31/26
See application file for complete search history.

(56) References Cited

U.S. PATENT DOCUMENTS

| | | | |
|---|---|---|---|
| 6,628,500 B1* | 9/2003 | Thomas | H01L 21/6833 361/230 |
| 2003/0117161 A1* | 6/2003 | Burns | G01R 31/2851 324/750.02 |
| 2008/0047952 A1* | 2/2008 | Mori | C04B 35/111 219/469 |
| 2011/0037492 A1* | 2/2011 | Seubert | G01R 1/0491 324/756.03 |

(Continued)

*Primary Examiner* — Dominic E Hawkins

(57) ABSTRACT

A semiconductor product testing device using an electric static carrier includes a movable carrier plate serving to carry at least one semiconductor product for transferring or testing process; the movable carrier plate being arranged with at least one electric static circuit to suck the at least one semiconductor product; a movable detecting probe set including: a probe set includes at one probe or a plurality of probes; a robot being connected to the probe set for deriving the probe set to a predetermined test position; a control device connected to the robot and including a control circuit for controlling movements of the robot and a testing circuit; and a computer connected to the control device for getting testing data from the testing circuit; the computer providing functions to cause the user to determine test items and ways of the testing circuit and the moving paths of the robot.

6 Claims, 8 Drawing Sheets

(56) References Cited

U.S. PATENT DOCUMENTS

| | | | |
|---|---|---|---|
| 2011/0249275 A1* | 10/2011 | Lal | G01B 11/25 |
| | | | 356/622 |
| 2012/0212247 A1* | 8/2012 | Sakata | G01R 31/2889 |
| | | | 324/754.03 |
| 2015/0298320 A1* | 10/2015 | Eisele | B25J 15/06 |
| | | | 294/24 |
| 2017/0023636 A1* | 1/2017 | Takita | G01R 31/2601 |

* cited by examiner

SEMICONDUCTOR PRODUCT TESTING DEVICE USING AN ELECTRIC STATIC CARRIER

FIELD OF THE INVENTION

The present invention is related to transfer of semiconductor products, and in particular to a semiconductor product testing device using an electric static carrier.

BACKGROUND OF THE INVENTION

The current trend for manufacturing of semiconductor products is to cause the sizes thereof to become thinner and thinner, and the functions of the semiconductor products become stronger and stronger and the memories have higher and higher capacities. For example, the thickness of the handset is required to be smaller and smaller, and therefore, the chips therein must become thinner and thinner. However, in the manufacturing process of the semiconductor products, the semiconductor products must be tested. In the conventional testing process, it is need to place the wafer or chips on a carrier and thus the carrier must be transferred to a testing tool. Then the semiconductor products are aligned to the probes of the testing tool manually or by a robot for testing and to get desired data.

In the prior art testing, in the transferring process, the wafers of chips are easy to be destroyed. Furthermore more time is consumed in the process of moving the wafers or chips from the carrier to the testing tool, even by robot or by manual operation. Moreover, these actions cause more cost in manufacturing and cause reduction of manufacturing.

In the prior art manufacturing process of wafers, chips or chip sets, a tray with a plurality of recesses thereon is formed. The semiconductor products are located within the recesses, but are not fixed therein. This causes that the semiconductor products are easily to be destroyed as they collide the walls of the recesses, even the semiconductor products are destroyed greatly so that they become unused. Moreover, the sizes of the semiconductor products installed within the recesses are confined by the sizes of the recesses. Different kinds of trays are necessary for installing different sizes of semiconductor products.

Because the above mentioned defects in the prior art structure for transfer of the semiconductor products, it is necessary to have a novel design which can reduce the times of movement of semiconductor products and provide well protections to the semiconductor products. Furthermore the testing process can be performed automatically without the probability of destroy.

SUMMARY OF THE INVENTION

Accordingly, the object of the present invention is to provide a semiconductor product testing device using an electric static carrier, wherein To achieve above object, the present invention provides a the movable carrier plate with an electric static circuit of the present invention cause the semiconductor products not to be destroyed in transferring so as to protect the semiconductor products. By the structure of the present invention, the semiconductor products need not to be moved out of the movable carrier plate and the probe set are directly near the semiconductor products for testing. After testing, the action of moving the semiconductor products to the carrier plate is not performed. If it is desired to download the semiconductor products, a reverse voltage is applied to the carrier plate to achieve the object to disappear the static electricity. Then the semiconductor products are taken out from the carrier plate. Therefore, in the whole process, the probability of the destroying the semiconductor products is greatly reduced. In the present invention, the semiconductor products are retained by static electricity and thus the sizes of the semiconductor products are not affected. Various sizes of the semiconductor products are suitable. Furthermore because the semiconductor products are absorbed by static electricity, the semiconductor products do not collide with each other or fall down. The whole process in transferring is simplified.

To achieve above object, the present invention provides a semiconductor product testing device using an electric static carrier, comprising:

a movable carrier plate capable of carrying at least one semiconductor product thereon; the movable carrier plate serving to carry the at least one semiconductor product for transferring or testing process; the movable carrier plate being arranged with at least one electric static circuit for generating static electricity to suck the at least one semiconductor product;

a movable detecting probe set including:

a probe set includes at one probe or a plurality of probes;

a robot being connected to the probe set for deriving the probe set to a predetermined test position so that the probe or probes are connected to the joints of the at least one semiconductor product for testing;

a control device connected to the robot and including a control circuit for controlling movements of the robot and a testing circuit; the testing circuit acquiring data through the probe or probes; and a computer connected to the control device for getting testing data from the testing circuit; the computer providing functions to cause the user to determine test items and ways of the testing circuit and the moving paths of the robot.

The electric state circuit includes an electrode pair which has two electrodes arranged at two ends of the electric static circuit and extend downwards; each of the electrodes penetrating through the movable carrier plate and exposes out of a lower end of the movable carrier plate.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

With reference to FIGS. 1 to 11, the structure of the present invention is illustrated. In the present invention, an electric static carrier serves to carry semiconductor products for transferring or testing. In the present invention, the semiconductor products may be wafers or chips or chip sets, such as MOSFET chips, RF chips, Power chips, etc. In this description, a chip 10' is used as description, but this is not used to confine the scope of the present invention.

The structure of the present invention includes the following elements.

Figure 1:
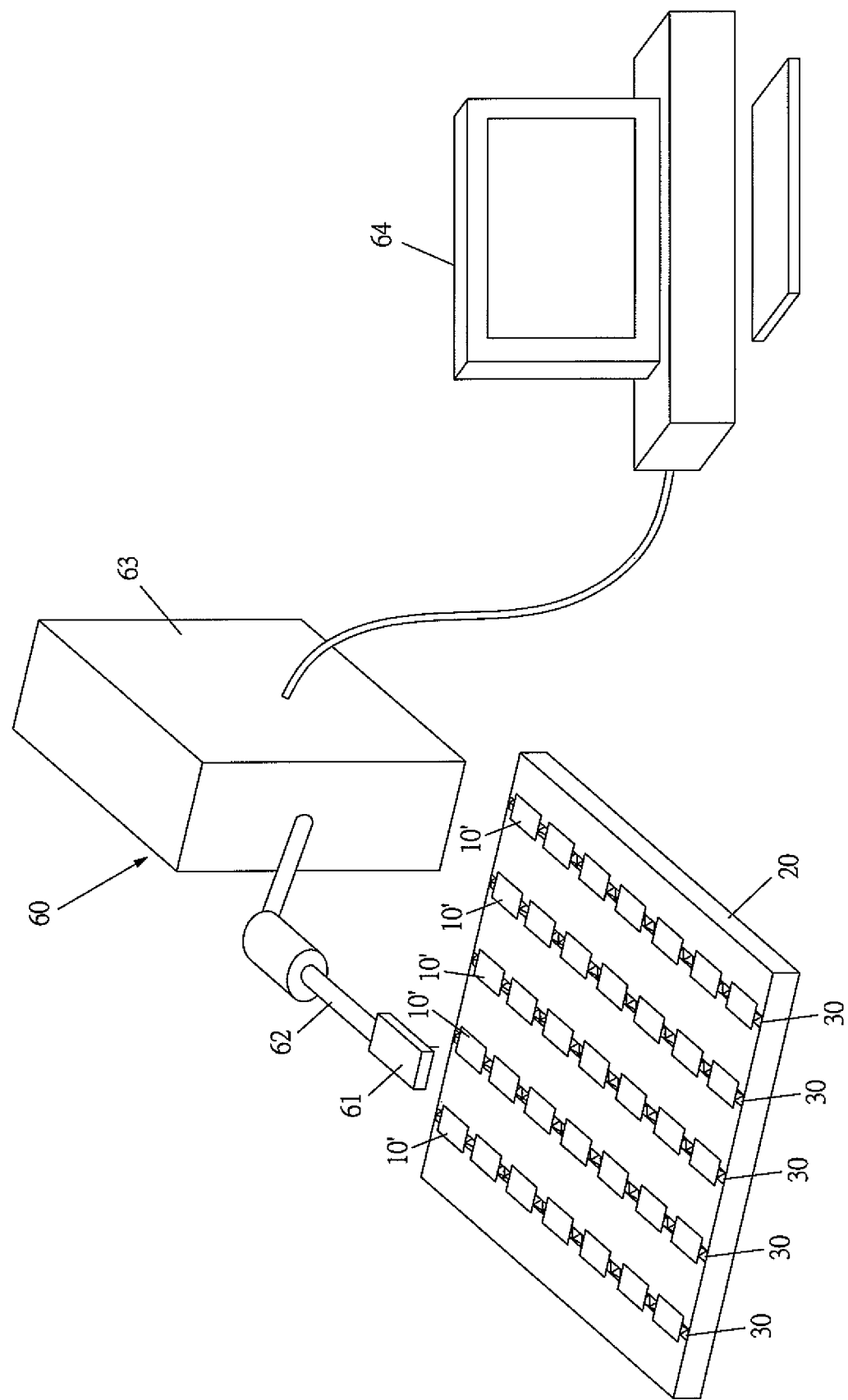
FIG. 1 is an assembled schematic view about the elements of the present invention.
Figure 3:
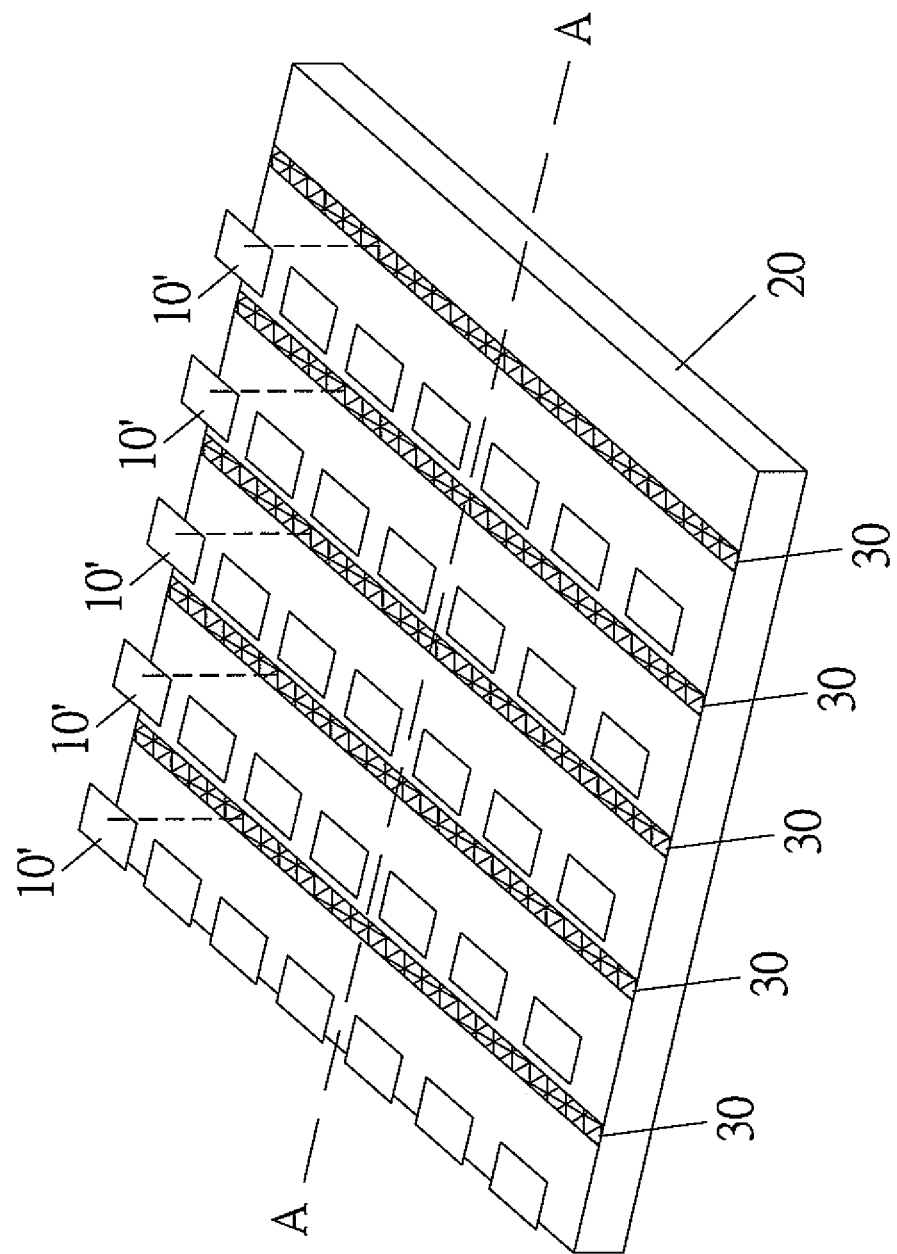
FIG. 3 is an exploded schematic view about the movable carrier plate and the chips thereon according to the present invention.
Figure 4:
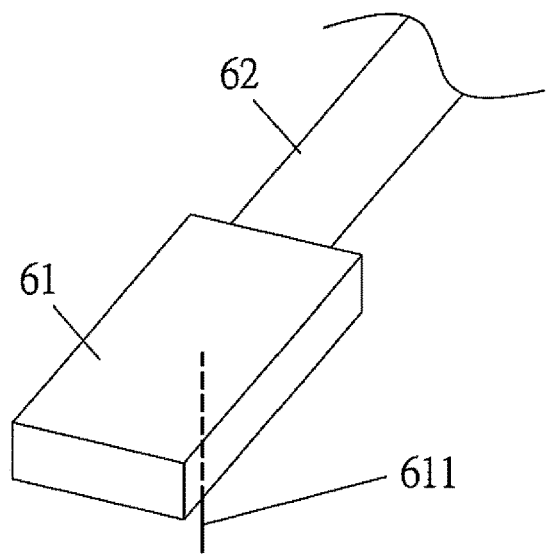
FIG. 4 is a schematic view showing that the probe set has only one probe according to the present invention.

A movable carrier plate 20 serves for carrying a plurality of chips 10' thereon (referring to FIGS. 1 and 3). The movable carrier plate 20 may be as a tray for carrying semiconductor products for, for example, transferring or testing process.

Figure 7:
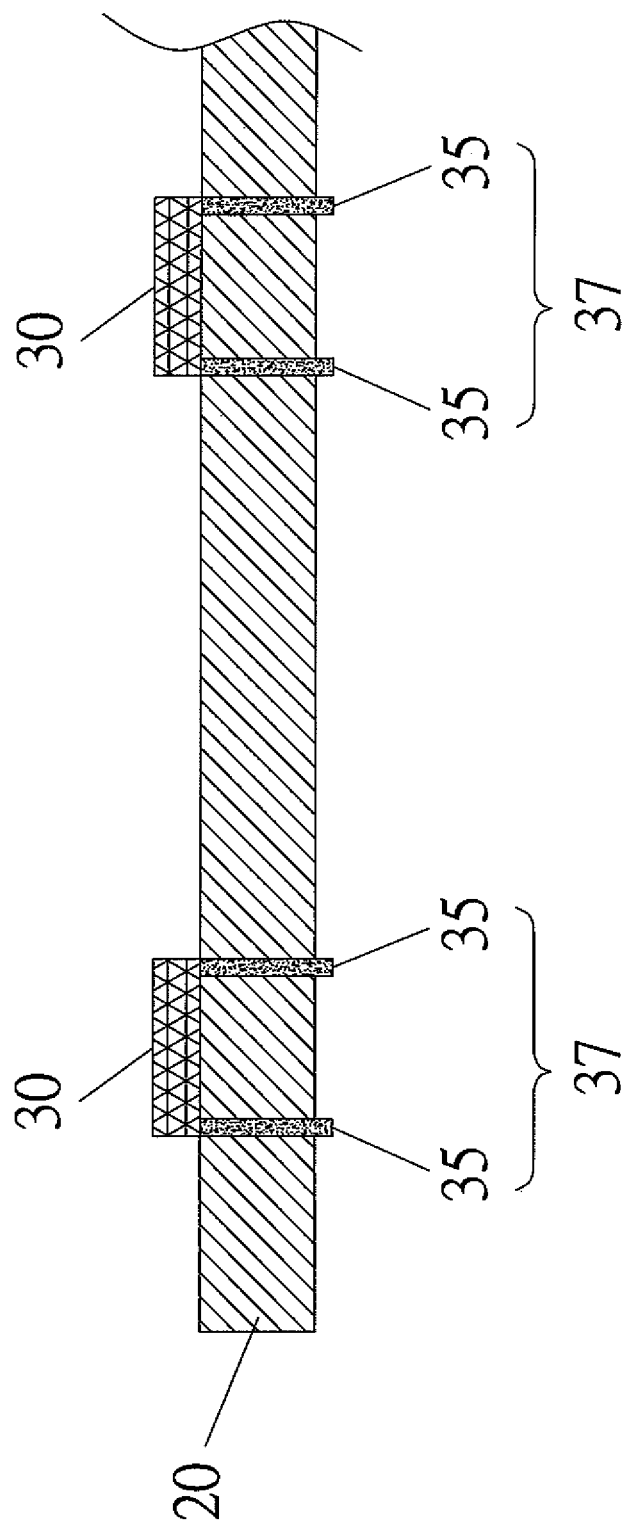
FIG. 7 is a schematic cross sectional view along line A-A of FIG. 3.
Figure 8:
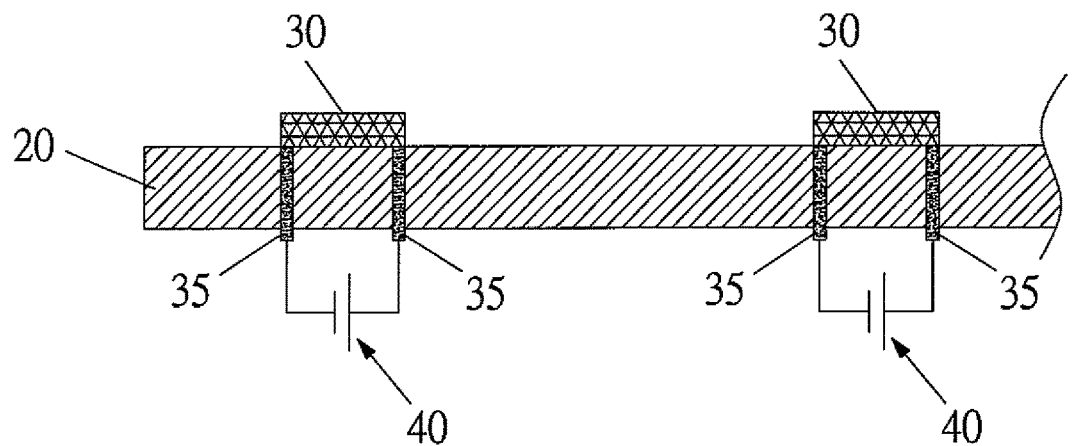
FIG. 8 is a schematic cross section view showing that an external voltage source is applied to the two electrodes of the electrode pair according to the present invention.

The movable carrier plate 20 is arranged with at least one electric static circuit 30 for generating static electricity. As illustrated in FIG. 7, the electric static circuit 30 showing an electrode pair 37. The electrode pair 37 includes two electrodes 35 which are at two ends of the electric static circuit 30 and extend downwards. Each of the electrodes 35 penetrates through the movable carrier plate 20 and exposes out of the lower end of the movable carrier plate 20. Each electrode 35 is connected to one respective electrode of an external voltage source 40 (referring to FIG. 8) so that the electrodes 35 are electrified and thus generate static electricity on surfaces of the movable carrier plate 20. By the absorption of the static electricity, the chip 10' is absorbed on the movable carrier plate 20. When the movable carrier plate 20 moves, the chip 10' moves therewith.

Figure 2:
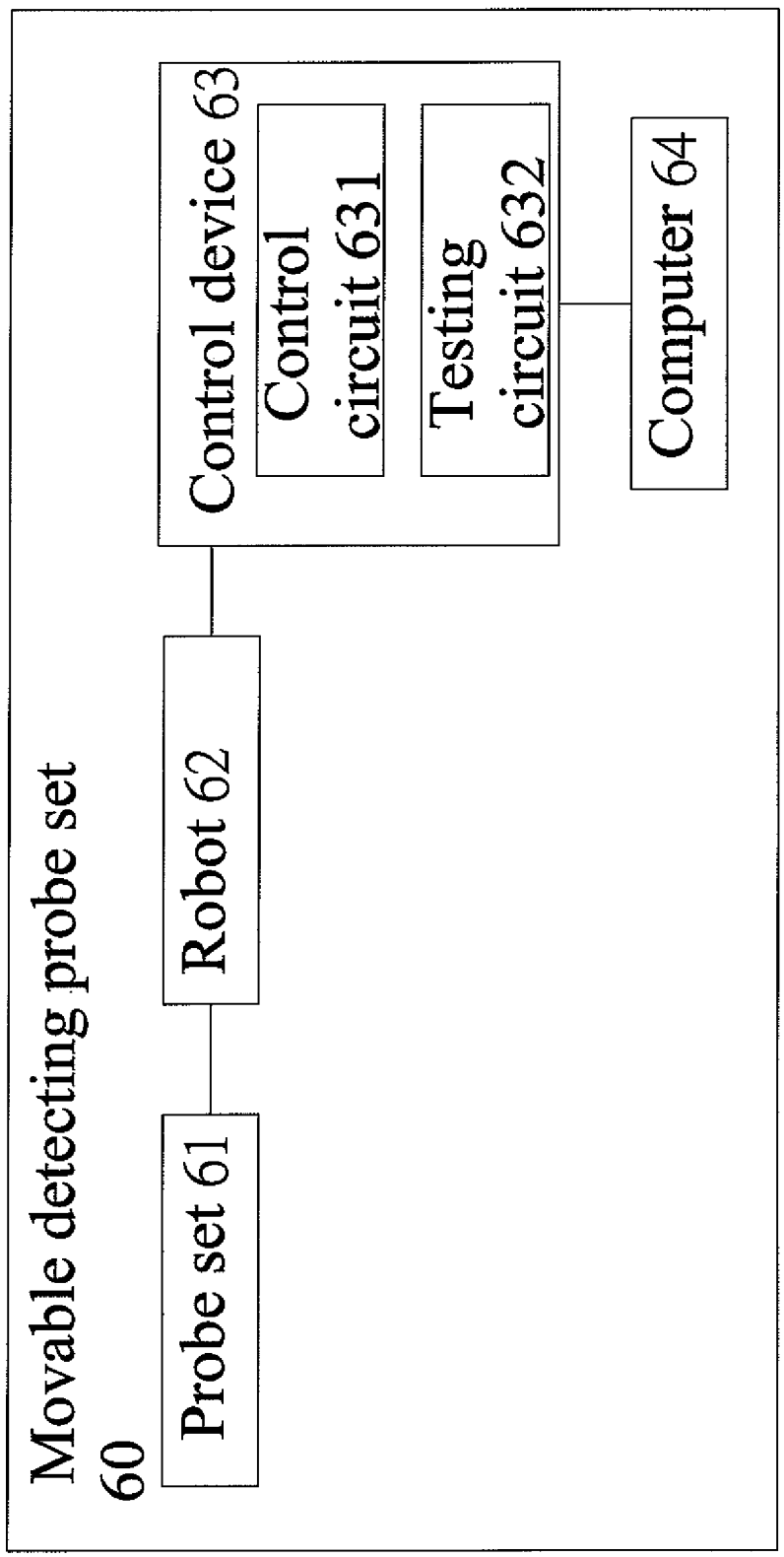
FIG. 2 is a structural block diagrams of the movable detecting probe set according to the present invention.
Figure 5:
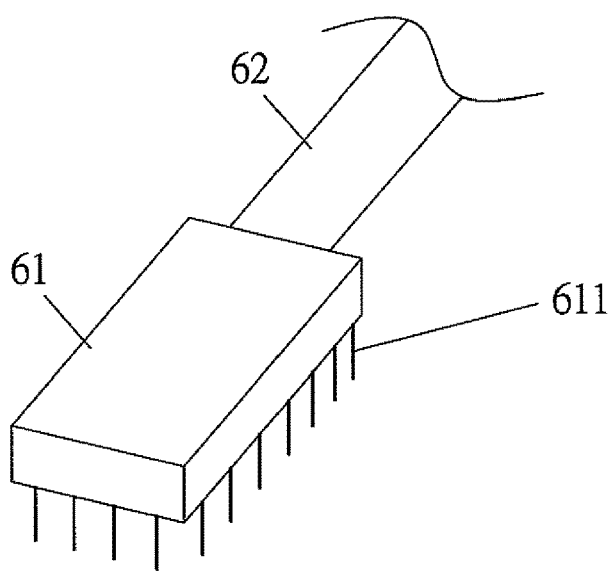
FIG. 5 is a schematic view showing that the probe set has a plurality of probes according to the present invention.

A movable detecting probe set 60, as illustrated in FIGS. 1 and 2, includes the following elements A probe set 61 includes at one probe 611 (referring to FIG. 4) or a plurality of probes 611 (referring to FIG. 5). When the probe set 61 includes a plurality of probes 611, the probes 611 may be formed as different subsets, each subset is used to test a predetermined chip. Therefore, the probe set 61 may be used to test a plurality of chips 10' at the same time.

A robot 62 is connected to the probe set 61 for deriving the probe set 61 to a desired test position so that the probes 611 are connected to the joints of the chip 10' for testing.

A control device 63 is connected to the robot 62 and includes a control circuit 631 for controlling the movement of the robot 62 and the testing circuit 632. The testing circuit 632 may get desired data through the probes 611.

A computer 64 is connected to the control device 63 for getting testing data from the testing circuit 632. The user may determines test items and ways of the testing circuit 632 and the moving paths of the robot 62 through the computer 64.

The movable carrier plate 20 may carry a plurality of chips 10' to a predetermined position and then drives the movable detecting probe set 60 so that the probe set 61 can move near to the plurality of chips 10' for testing the chips 10' and acquiring needed data.

Figure 6:
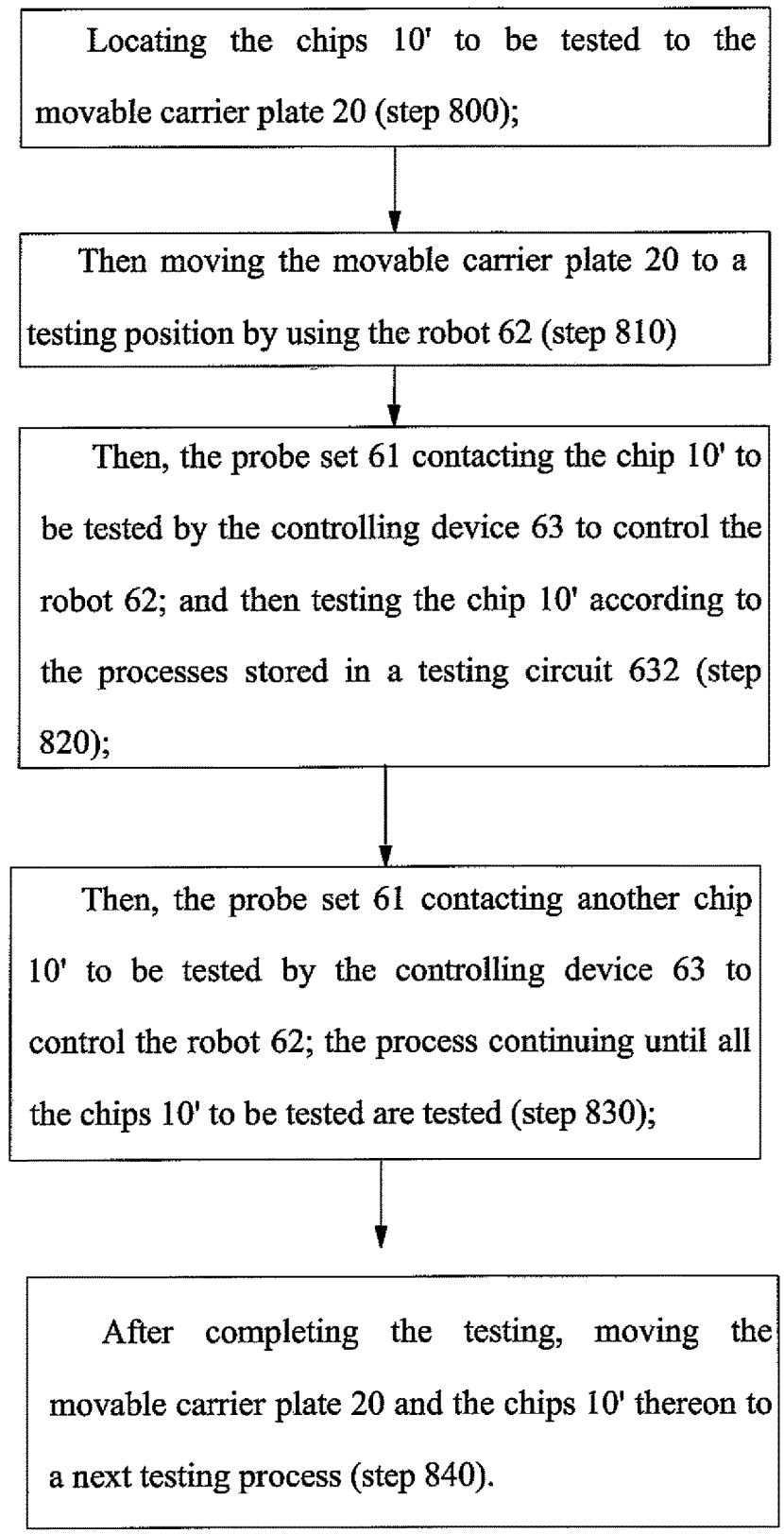
FIG. 6 is a flow diagram showing the process of the present invention.

As illustrated in FIG. 6, the procedure for testing includes the following steps of:

Locating the chips 10' to be tested to the movable carrier plate 20 (step 800);

Then moving the movable carrier plate 20 to a testing position by using the robot 62 (step 810)

Then, the probe set 61 contacting the chip 10' to be tested by the controlling device 63 to control the robot 62; and then testing the chip 10' according to the processes stored in a testing circuit 632 (step 820);

Then, the probe set 61 contacting another chip 10' to be tested by the controlling device 63 to control the robot 62; the process continuing until all the chips 10' to be tested are tested (step 830);

After completing the testing, moving the movable carrier plate 20 and the chips 10' thereon to a next testing process (step 840).

Figure 9:
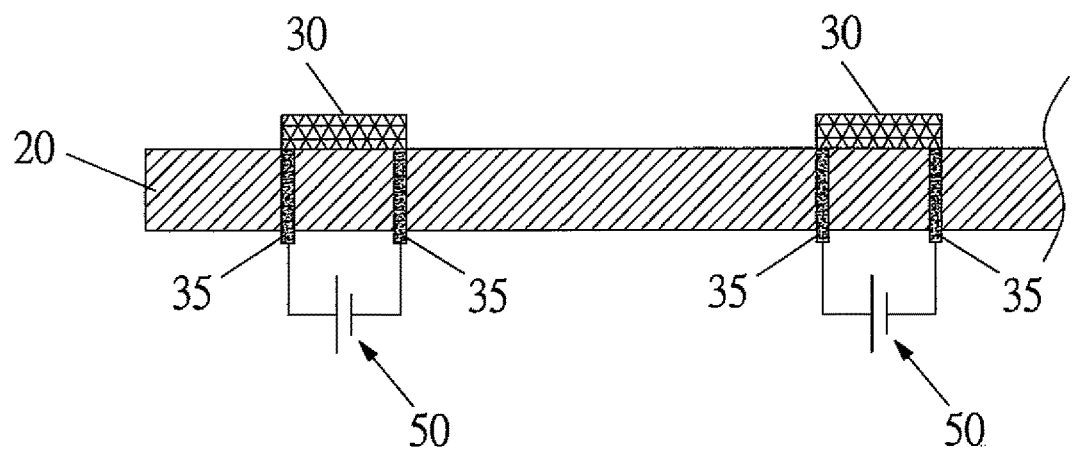
FIG. 9 is a schematic cross section view showing that an external voltage source is applied to the two electrodes of the electrode pair according to the present invention, wherein the connection of the voltage source to the electrodes of the electrode pair is reversed from the original connection.

When it is needed that the chip 10' removes from the movable carrier plate 20, the two electrodes of the voltage source 40 originally connecting two the two electrodes 35 of the electrode pair 37 are reversed (that is, one positive electrode of the voltage source 40 original connected to a first one of the electrode 35 of the electrode pair 37 now leaves from this first electrode 35 and then is connected to a second electrode 35 of the electrode pair 37; likely, the one negative electrode of the voltage source 40 original connected to the second one of the electrode 35 of the electrode pair 37 now leaves from this second electrode 35 and then is connected to the first electrode 35 of the electrode pair 37) so that the static electricity disappears (referring to FIG. 9). Therefore, the movable carrier plate 20 does not absorb the chip 10' so that the chip 10' leaves from the movable carrier plate 20 to achieve the object of transferring.

Figure 10:
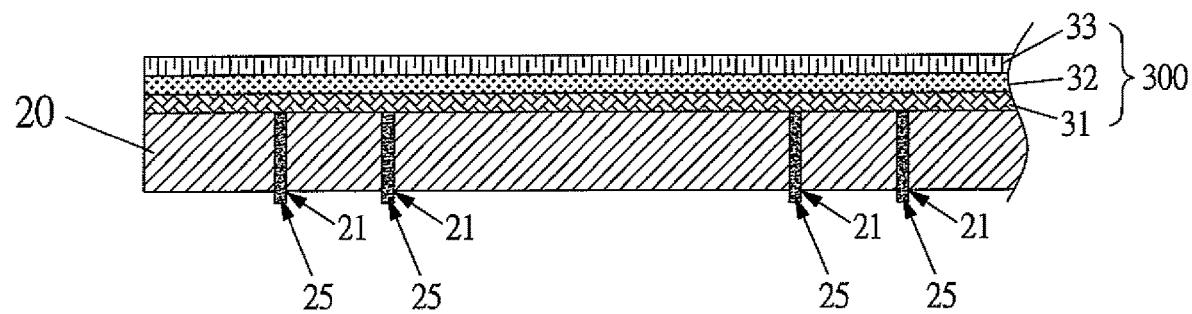
FIG. 10 is a schematic cross section view showing the manufacturing process of the static electricity of the present invention.
Figure 11:
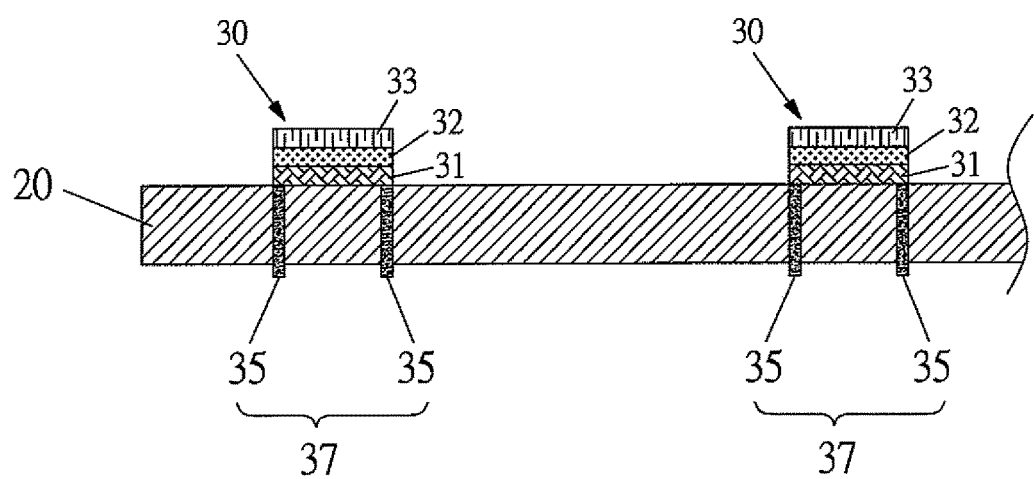
FIG. 11 is a schematic cross section view showing structure of FIG. 10, which is etched.

With reference to FIG. 10, in manufacturing process of the electric static circuit 30, an etching process is used. The movable carrier plate 20 is formed with pores firstly and electric conduction material, such as copper, is filled in the pores. The pores are paired and thus the electric conduction materials are formed as pairs and expose out of a lower surface of the movable carrier plate 20 to be as the electrodes 35 of the electrode pair 37 of the electric static circuit 30.

With reference to FIG. 10, a layer of copper 31, a layer nickel 32 and a layer gold 33 are plated on the movable carrier plate 20 sequentially so as to form as a thin film 300. The copper is at the inner side of the thin film 300 to contact the movable carrier plate 20. Then by etching process, the undesired material is etched, and those left is the electric static circuit 30 (referring to FIG. 11). The electric static circuit 30 must be made to be corresponding to the electrode pair 37 so that when the two electrodes 35 of the electrode pair 37 are connected to the positive and negative electrodes of the voltage source 40, static electricity is generated by the electric static circuit 30.

Currently, with development of the semiconductor technology, the semiconductor products are thinner and thinner. In the process of manufacturing semiconductor products, a plurality of testing processes are necessary and thus the semiconductor products need to be transferred to different locations for testing. Since the semiconductor products are very thin, and they are easy to be destroyed to induce a great lose. Therefore, the movable carrier plate with an electric static circuit of the present invention cause the semiconductor products not to be destroyed in transferring so as to protect the semiconductor products. By the structure of the present invention, the semiconductor products need not to be moved out of the movable carrier plate and the probe set are directly near the semiconductor products for testing. After testing, the action of moving the semiconductor products to the carrier plate is not performed. If it is desired to download the semiconductor products, a reverse voltage is applied to the carrier plate to achieve the object to disappear the static electricity. Then the semiconductor products are taken out from the carrier plate. Therefore, in the whole process, the probability of the destroying the semiconductor products is greatly reduced.

In the present invention, the semiconductor products are retained by static electricity and thus the sizes of the semiconductor products are not affected. Various sizes of the semiconductor products are suitable. Furthermore because the semiconductor products are absorbed by static electricity, the semiconductor products do not collide with each other or fall down. The whole process in transferring is simplified.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A semiconductor product testing device using an electric static carrier, comprising:
   a movable carrier plate capable of carrying at least one semiconductor product thereon; the movable carrier plate serving to carry the at least one semiconductor product for transferring or testing process; the movable carrier plate being arranged with at least one electric static circuit for generating static electricity to suck the at least one semiconductor product;
   a movable detecting probe set including:
   a probe set includes at one probe or a plurality of probes;
   a robot being connected to the probe set for deriving the probe set to a predetermined test position so that the probe or probes are connected to the joints of the at least one semiconductor product for testing;
   a control device connected to the robot and including a control circuit for controlling movements of the robot and a testing circuit; the testing circuit acquiring data through the probe or probes;
   a computer connected to the control device for getting testing data from the testing circuit; the computer providing functions to cause the user to determine test items and ways of the testing circuit and the moving paths of the robot;
   wherein the electric state circuit includes an electrode pair which has two electrodes arranged at two ends of the electric static circuit and extend downwards; each of the electrodes penetrating through the movable carrier plate and exposes out of a lower end of the movable carrier plate;
   wherein the movable carrier plate is formed with pores firstly and electric conduction material is filled in the pores; the pores are paired and thus the electric conduction materials are formed as pairs and expose out of a lower surface of the movable carrier plate to be as the electrodes of the electrode pair of the electric static circuit; and
   a layer of copper, a layer nickel and a layer gold are plated on the movable carrier plate sequentially so as to form as a thin film; the copper is at the inner side of the thin film to contact the movable carrier plate; and then by etching process, the undesired material is etched, and those left is the electric static circuit; the electric static circuit must be made to be corresponding to the electrode pair.

2. The semiconductor product testing device using an electric static carrier as claimed in claim 1, wherein when the probe set includes a plurality of probes, the probes are formed as different subsets, each subset is used to test a predetermined semiconductor product; therefore, the probe set is used to test a plurality of semiconductor products at the same time.

3. The semiconductor product testing device using an electric static carrier as claimed in claim 1, wherein each electrode is connected to one respective electrode of an external voltage source so that the electrodes are electrified and thus generate static electricity on surfaces of the movable carrier plate; by the absorption of the static electricity, the at least one semiconductor product is absorbed on the movable carrier plate.

4. The semiconductor product testing device using an electric static carrier as claimed in claim 1, wherein when it is needed that the at least one semiconductor product removes from the movable carrier plate, the two electrodes of the voltage source originally connecting two the two electrodes of the electrode pair are reversed, that is, the connection of the voltage source to the electrodes of the electrode pair is reversed from the original connection, so that the static electricity disappears; therefore, the movable carrier plate does not absorb the at least one semiconductor product.

5. The semiconductor product testing device using an electric static carrier as claimed in claim 1, wherein a procedure for testing includes following steps of:
   locating the at least one semiconductor product to be tested to the movable carrier plate;
   moving the movable carrier plate to a testing position by using the robot;
   the probe set contacting the at least one semiconductor product to be tested by the controlling device to control the robot; and then testing the at least one semiconductor product according to processes stored in a testing circuit;
   the probe set contacting another at least one semiconductor product to be tested by the controlling device to control the robot; the process continuing until all the semiconductor products to be tested are tested; and
   after completing the testing, moving the movable carrier plate and the at least one semiconductor product thereon to a next testing process.

6. The semiconductor product testing device using an electric static carrier as claimed in claim 1, wherein the movable carrier plate is made as a tray.

* * * * *